(12) United States Patent
Ohishi et al.

(10) Patent No.: US 7,611,581 B2
(45) Date of Patent: Nov. 3, 2009

(54) COATING APPARATUS, COATING METHOD AND COATING-FILM FORMING APPARATUS

(75) Inventors: Seiji Ohishi, Kanagawa (JP); Akihiko Nakamura, Kanagawa (JP)

(73) Assignee: Tokyo Ohka Kogyo Co., Ltd., Kanagawa (JP)

(*) Notice: Subject to any disclaimer, the term of this patent is extended or adjusted under 35 U.S.C. 154(b) by 661 days.

(21) Appl. No.: 11/288,991

(22) Filed: Nov. 29, 2005

(65) Prior Publication Data

US 2006/0115992 A1 Jun. 1, 2006

(30) Foreign Application Priority Data

Nov. 29, 2004 (JP) ............... 2004-344819

(51) Int. Cl.
*B05C 5/02* (2006.01)
(52) U.S. Cl. .............. 118/52; 118/56; 118/319; 118/320; 118/323; 134/902; 901/43
(58) Field of Classification Search .......... 118/52, 118/56, 319, 320, 323; 134/902; 901/43; 451/398, 400, 401, 413, 60, 446
See application file for complete search history.

(56) References Cited

U.S. PATENT DOCUMENTS 5,514,214 A * 5/1996 Joel et al. ............... 118/52
5,709,593 A * 1/1998 Guthrie et al. ........... 451/287
6,413,154 B1 * 7/2002 Togawa et al. .......... 451/285

FOREIGN PATENT DOCUMENTS

| JP | 03148111 | * | 6/1991 |
| JP | 07-289973 | | 11/1995 |
| JP | 08-022952 | | 1/1996 |
| JP | 2001-269610 | | 10/2001 |
| JP | 2002-059060 | | 2/2002 |
| JP | 2003-245591 | | 9/2003 |
| JP | 2004--209340 | | 7/2004 |

* cited by examiner

*Primary Examiner*—Laura Edwards
(74) *Attorney, Agent, or Firm*—Carrier, Blackman & Associates, P.C.; Joseph P. Carrier; William D. Blackman

(57) ABSTRACT

A coating apparatus is provided in which a coating liquid supplied onto a surface of a substrate such as a semiconductor wafer and a glass substrate can be easily leveled so as to have a uniform thickness without any edge bead. The coating apparatus comprises a tray, a nozzle for supplying a coating liquid, and a squeegee which serves as an applicator for spreading a coating liquid. The tray has a recessed portion into which a substrate is placed, and a spinner chuck is provided in the recessed portion. In the spinner chuck, a chuck for attracting the substrate is attached to the upper end of a spinner shaft which can be lifted and lowered, and the upper surface of the chuck and the bottom surface of the recessed portion are arranged to be in the same plane in a state where the spinner shaft is lowered to the lowest position.

7 Claims, 6 Drawing Sheets

COATING APPARATUS, COATING METHOD AND COATING-FILM FORMING APPARATUS

CROSS-REFERENCE TO RELATED APPLICATIONS

The present invention claims priority under 35 USC 119 based on Japanese patent application No. 2004-344819, filed 29 Nov. 2004, the entire content of which is incorporated herein by reference.

BACKGROUND OF THE INVENTION

1. Field of the Invention

The present invention relates to an apparatus and a method for applying a coating liquid or a developing liquid on a surface of a substrate such as a semiconductor wafer, a glass substrate, or the like so as to form a coating film or the like.

2. Description of Prior Art

There have been known apparatuses disclosed in Documents 1-6 as an apparatus for forming a coating film having a uniform thickness on a surface of a substrate.

Document 1 has disclosed that a resist liquid is supplied with a predetermined width from a nozzle to a surface of a glass substrate, in which the nozzle is movable in a short side direction of the glass substrate, and the resist liquid supplied with a predetermined width is leveled to have a uniform thickness with a plate (squeegee) which moves in a long side direction of the glass substrate.

Document 2 has disclosed that a developing liquid is supplied from a nozzle to a surface of a substrate which is horizontally spun by a spin chuck, and the developing liquid is applied onto the surface of the substrate to have a predetermined thickness while the developing liquid is received by a spreading member (squeegee) provided to keep a minute distance from the surface of the substrate.

Documents 3 and 4 have disclosed that a substrate is placed into a recessed portion provided in a substrate stage so as to make the upper surface of the substrate stage and the upper surface of the substrate in the same plane, and a coating liquid is supplied from a slit nozzle to the upper surface of the substrate stage including the substrate so as to form a coating film having a predetermined thickness on the surface of the substrate.

Document 5 has disclosed that while a tray having a recessed portion for accommodating a substrate is transferred, a coating liquid is supplied to a substrate placed in the recessed portion by using a slit nozzle, a coating film is formed by moving the substrate together with the tray, and thereafter the tray alone is moved to a cleaning station and a drying station.

Document 6 has disclosed that a pre-dispensing area is provided adjacent to a recessed portion for accommodating a substrate in a similar tray structure to Document 5.

[Document 1] Japanese Patent Application Publication No. 7-289973

[Document 2] Japanese Patent Application Publication No. 8-022952

[Document 3] Japanese Patent Application Publication No. 2001-269610

[Document 4] Japanese Patent Application Publication No. 2002-59060

[Document 5] Japanese Patent Application Publication No. 2003-245591

[Document 6] Japanese Patent Application Publication No. 2004-209340

However, in the method as disclosed in Document 1, since the film thickness becomes large at the starting point of the coating, it is impossible to form a coating film entirely to the periphery of the glass substrate.

In the method as disclosed in Document 2, since the developing liquid is spread by spinning the substrate, the liquid moves toward the outside of the substrate and the amount of the liquid tends to be less in the center.

In the case of using a slit nozzle as in Document 3 and Document 4, it is difficult to supply a coating liquid with a uniform thickness in a side direction of the substrate. For example, if the width of the slit nozzle is larger in a longitudinal direction of the slit nozzle even partly, the coating liquid will be supplied excessively from that part. Also, if there is variation in the pressure during the coating by the slit nozzle, the amount of the supplied coating liquid will also be varied. Thus, the structure of the slit nozzle requires delicate adjustment, which makes it difficult to handle.

Since Document 5 also uses a slit nozzle, its handing is difficult. In addition, this technique has a disadvantage in terms of space because the cleaning station and the drying station are separate from each other. The technique disclosed in Document 6 has the same drawback as in Document 5.

SUMMARY OF THE INVENTION

According to the present invention, there is provided a coating apparatus including a rotatable tray having a recessed portion for accommodating a substrate, a nozzle for supplying a coating liquid, and an applicator for spreading the coating liquid, wherein the recessed portion has a depth which allows an upper surface of a substrate and an upper surface of the tray to be in the same plane when the substrate is accommodated into the recessed portion and the recessed portion has a similar shape to the substrate, the nozzle for supplying a coating liquid is positioned above a non-recessed portion of the tray, and the applicator is relatively movable in a horizontal direction in a state of maintaining a certain distance with respect to the upper surface of the substrate accommodated into the recessed portion.

It is preferable that the applicator is a squeegee, a roller, or the like. Also, in the recessed portion of the tray, it is possible to provide a spinner chuck which can be lifted and lowered. Instead of the spinner chuck, a lifted and lowered pin may be provided.

According to the present invention, there is also provided a coating method, which uses the above-mentioned coating apparatus, including the following steps:

Step 1: placing a substrate into the recessed portion of the tray;

Step 2: supplying a coating liquid from the nozzle for supplying a coating liquid onto a non-recessed portion of the upper surface of the tray, and forming a coating liquid pool having an arc shape or a linear shape at an upstream side of the substrate with respect the moving direction of the applicator as a reference by at least one of rotating the tray by a predetermined angle and moving the nozzle;

Step 3: spreading the coating liquid of the coating liquid pool onto the upper surface of the substrate by moving the applicator toward the substrate;

Step 4: releasing the substrate from the recessed portion of the tray.

The method may further include the following steps:

Step 5: cleaning the tray by rotating the tray while a cleaning liquid is supplied to the upper surface of the tray from which the substrate has been released;

Step 6: drying the tray by continuing tray rotation after the cleaning liquid is dispersed.

A coating film is formed by baking and drying the coating liquid after step 4. The structure of a coating-film forming apparatus may include a substrate loader/unloader portion, a coating portion for a surface of a substrate, a substrate heating portion, a cleaning portion for a rear surface or an end surface of a substrate, and a robot for transferring a substrate to and from each portion, in which the above-mentioned coating apparatus may be used as the coating portion.

By providing the same rotatable tray as provided in the coating portion in the substrate heating portion and the cleaning portion, the transfer by the robot can be performed efficiently.

DETAILED DESCRIPTION OF PREFERRED EMBODIMENTS

Figure 1:
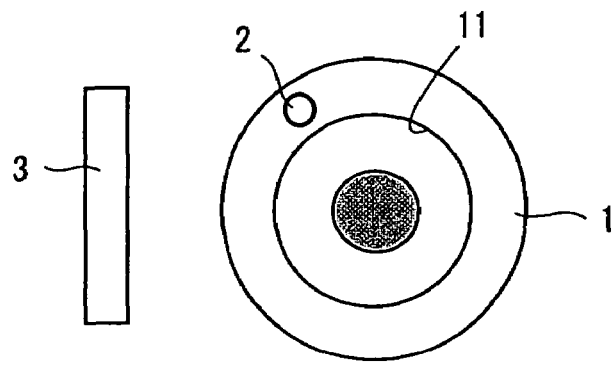
FIG. 1 (a) is a plan view of a coating apparatus in a waiting state, and FIG. 1 (b) is a sectional view of the coating apparatus in a waiting state.
Figure 1:
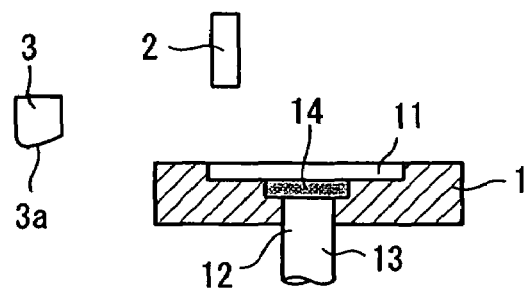

Hereinafter, embodiments according to the present invention will be explained with reference to the attached drawings. FIGS. 1-8 explain the present invention in the order of the processes. In each figure, (a) is a plan view and (b) is a sectional view.

The coating apparatus according to the present invention comprises a tray 1, a nozzle for supplying a coating liquid 2, and a squeegee 3 which serves as an applicator for spreading the coating liquid.

The tray 1 has a recessed portion 11 into which a substrate W is placed. The recessed portion 11 has a similar shape to the substrate W with respect to the plan view. The depth of the recessed portion 11 is substantially equal to the thickness of the substrate W.

A spinner chuck 12 is provided in the recessed portion 11. In the spinner chuck 12, a chuck 14 for attracting the substrate W is attached to the upper end of a spinner shaft 13 which can be lifted and lowered, and the upper surface of the chuck 14 and the bottom surface of the recessed portion 11 are arranged to be in the same plane in a state where the spinner shaft 13 is lowered to the lowest position.

In the embodiment shown in the figure, the shape of the chuck 14 is circular with respect to the plan view. However, the shape may be rectangular, and it is possible to transmit the rotation of the spinner chuck 13 directly to the tray 1 in this instance.

The nozzle for supplying a coating liquid 2 is positioned above a non-recessed portion of the tray 1. More specifically, in the present embodiment, the nozzle 2 is positioned toward the squeegee side with respect to the center of the tray 1.

The squeegee 3 has a rod shape, and the lower surface 3a of the squeegee is rounded. The squeegee 3 is movable back and forth toward the tray 1 by using a cylinder unit which is not shown in the figure. When the squeegee 3 is positioned above the tray 1, a certain distance is kept between the lower surface 3a of the squeegee 3 and the upper surface of the substrate W, and the distance determines the thickness of the coating film.

Figure 2:
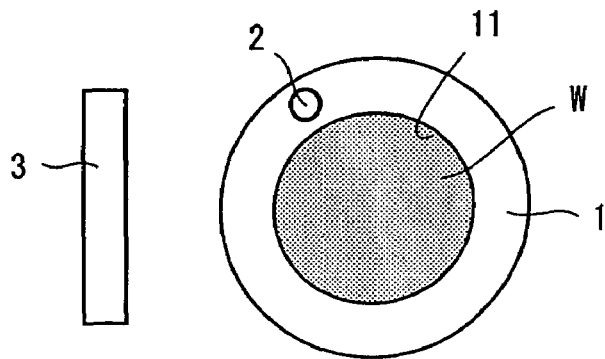
FIG. 2 (a) is a plan view of a recessed portion of a tray in a state where a substrate is placed, and FIG. 2 (b) is a sectional view of the recessed portion of the tray in a state where a substrate is placed.
Figure 2:
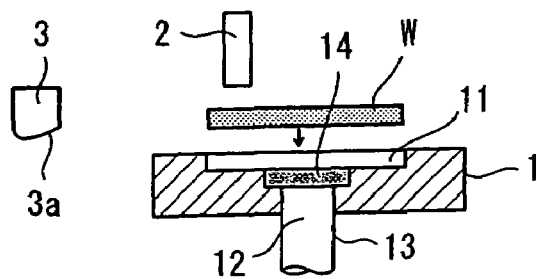

The processes of applying a coating liquid to the substrate W by using the above-mentioned coating apparatus will be explained. The state shown in FIG. 1 is a waiting state, and firstly, the substrate W is placed into the recessed portion 11 as shown in FIG. 2.

Figure 3:
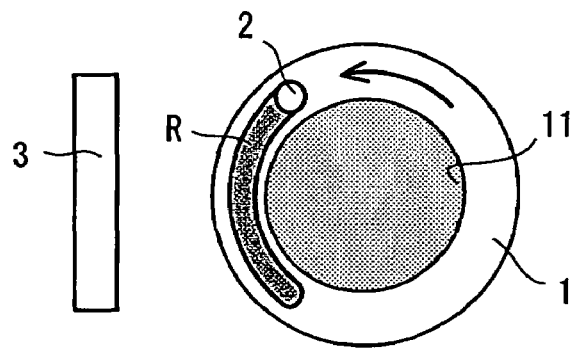
FIG. 3 (a) is a plan view showing a state where a coating liquid pool is formed on the upper surface of the tray, and FIG. 3 (b) is a sectional view showing the state where a coating liquid pool is formed on the upper surface of the tray.
Figure 3:
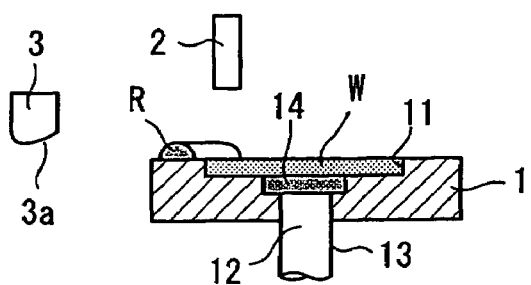

Next, a coating liquid such as a resist liquid is applied from the nozzle 2 to the upper surface of the tray 1, and the tray 1 is rotated by the spinner shaft 13. The rotation angle is about 90-120°. By rotating the tray 1, a coating liquid pool R is formed on the upper surface of the tray 1 as shown in FIG. 3. In the present embodiment, the coating liquid pool R is formed in front of the substrate W.

In order to form a coating liquid pool, it is also possible to move the nozzle 2. In this instance, when the movement course of the nozzle 2 is an arc shape, a similar pool to the above is formed. However, the movement course of the nozzle 2 may be a linear shape, or a pool may be discontinuous.

Figure 4:
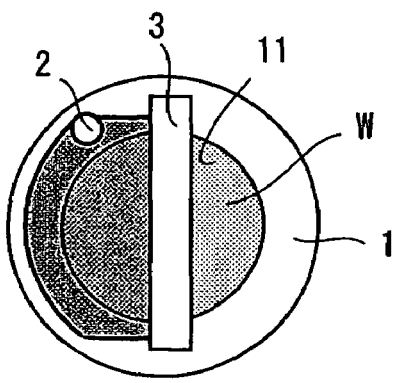
FIG. 4 (a) is a plan view showing a state where the coating liquid is leveled by a squeegee, and FIG. 4 (b) is a sectional view showing the state where the coating liquid is leveled by a squeegee.
Figure 4:
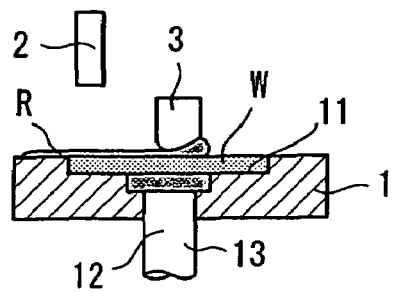
Figure 5:
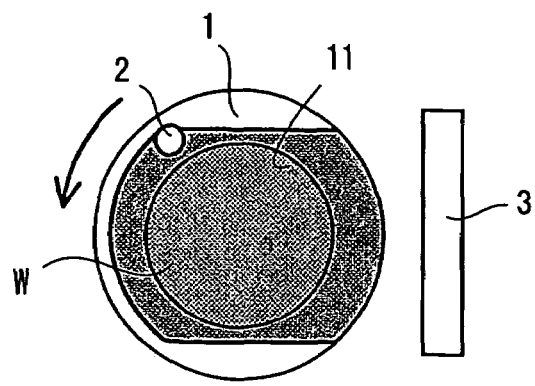
FIG. 5 (a) is a plan view showing a state where the coating liquid is dried by rotating the tray after the coating is finished, and FIG. 5 (b) is a sectional view showing the state where the coating liquid is dried by rotating the tray after the coating is finished.
Figure 5:
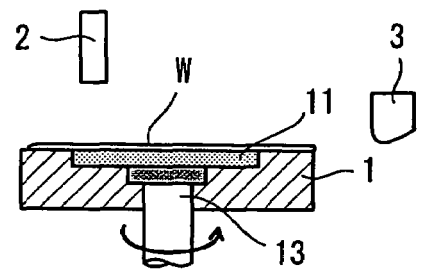
Figure 6:
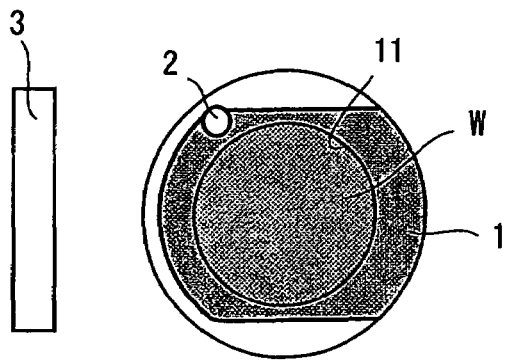
FIG. 6 (a) is a plan view showing a state where the substrate is lifted from the tray, and FIG. 6 (b) is a sectional view showing the state where the substrate is lifted from the tray.
Figure 6:
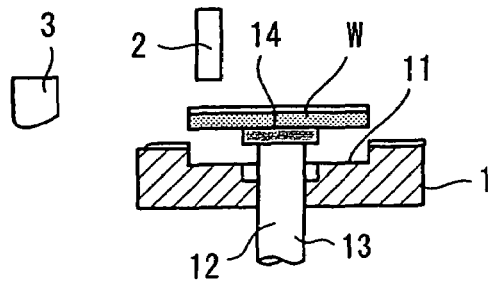

Next, as shown in FIG. 4, the squeegee 3 is moved horizontally toward the substrate W, so that the coating liquid of the coating liquid pool R is spread on the upper surface of the substrate W by the lower surface 3a of the squeegee 3. Next, as shown in FIG. 5, after the coating is finished, a uniform layer of the coating liquid formed on the substrate W is dried by rotating the tray 1.

After the layer of the coating liquid is dried, the spinner shaft 13 is lifted and the substrate W is released from the recessed portion 11. With this, the coating film is automatically cut between the substrate W and the recessed portion 11.

Figure 7:
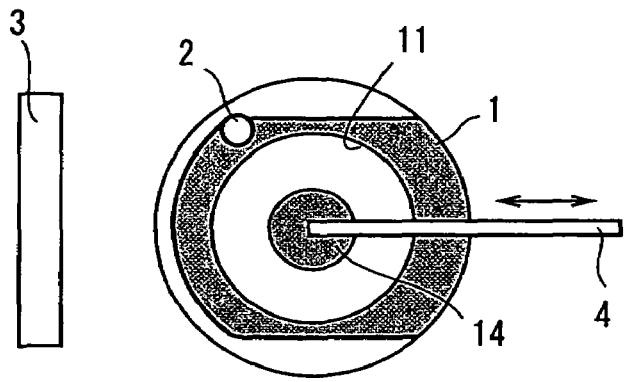
FIG. 7 (a) is a plan view showing a state where the tray is cleaned, and FIG. 7 (b) is a sectional view showing the state where the tray is cleaned.
Figure 7:
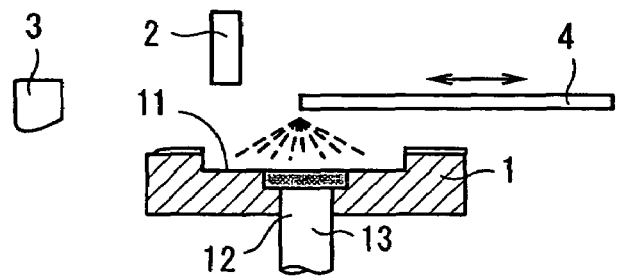
Figure 8:
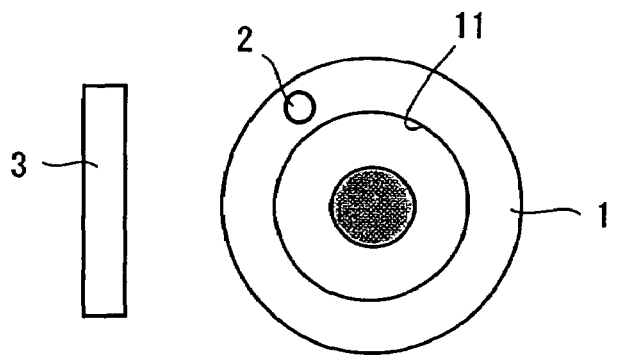
FIGS. 8 (a) and (b) are the same view as FIG. 1 showing a state where the recovery is finished.
Figure 8:
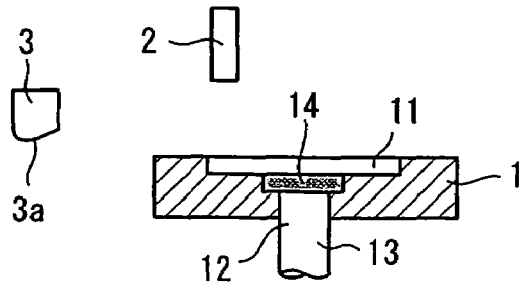

After the substrate W is released from the recessed portion 11, a nozzle for supplying a cleaning liquid 4 is moved to be positioned above the tray 1, and a cleaning liquid is supplied onto the upper surface of the tray 1 while the nozzle for supplying a cleaning liquid 4 is moved back and forth as shown in FIG. 7. Also, the tray 1 is rotated so as to remove the coating liquid left on the tray 1. It is also possible to efficiently remove the coating liquid by applying an additional brush. Next, the tray 1 is dried by rotating, and the state shown in FIG. 8 is obtained. The state shown in FIG. 8 is the same state as the waiting state shown in FIG. 1.

Figure 9:
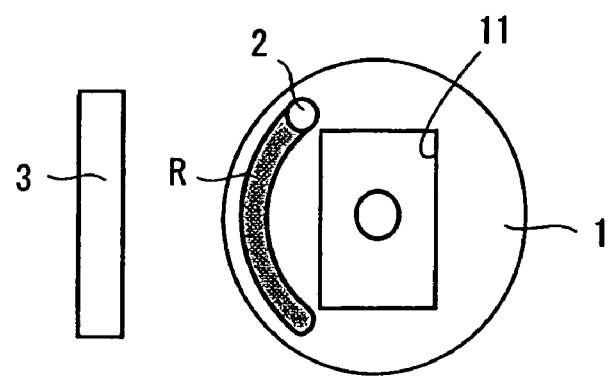
FIG. 9(a) is a plan view of another embodiment of a coating apparatus and coating method according to the invention.
FIG. 9(b) is a plan view of another embodiment of a coating apparatus and coating method according to the invention.
FIG. 9(c) is a plan view of another embodiment of a coating apparatus and coating method according to the invention.
Figure 9:
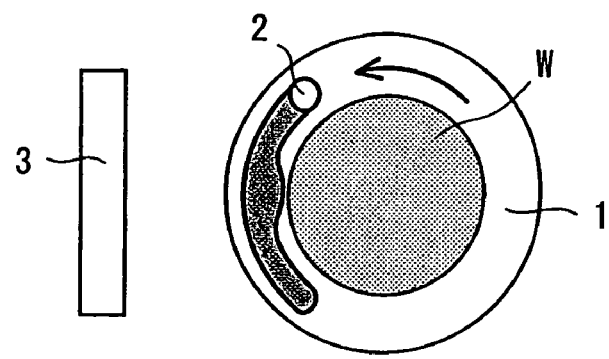
Figure 9:
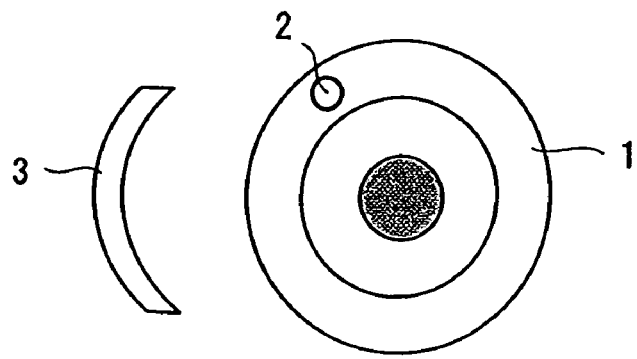

FIGS. 9 (a)-(c) are plan views of other embodiments of a coating apparatus and coating method of the invention. In the embodiment shown in FIG. 9 (a), the shape of the recessed portion 11 is a rectangular shape with respect to the plan view, which corresponds to a glass substrate for liquid crystal.

In the embodiment shown in FIG. 9 (b), the intermediate area of the coating liquid pool R is made larger than the other area so as to compensate the shortage of the coating liquid in the central area.

In the embodiment shown in FIG. 9 (c), the shape of the squeegee 3 is an arc shape with respect to the plan view so as to gather the coating liquid toward the center when the coating liquid is spread. However, the shape of the squeegee 3 is not limited to this, and an arc shape of the reverse direction may be used.

Figure 10:
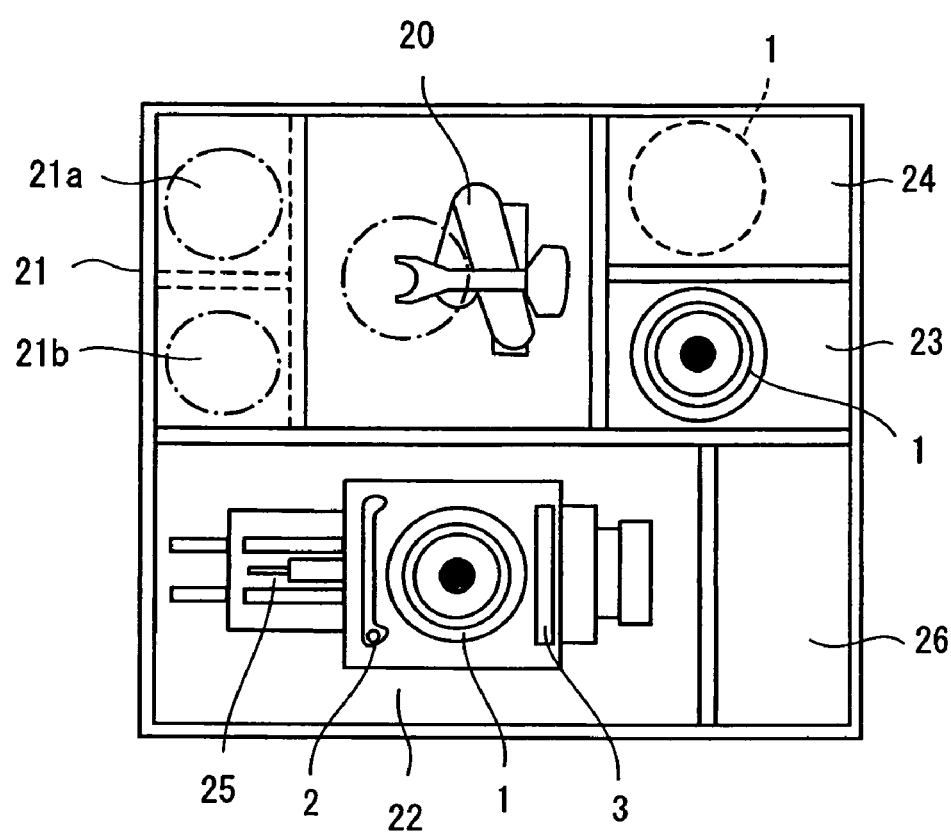
FIG. 10 is a whole plan view of a coating-film forming apparatus according to the present invention.

FIG. 10 is a whole plan view of a coating-film forming apparatus according to the present invention. The coating-film forming apparatus comprises a robot 20 provided with an extendable arm, and a loader/unloader portion 21, a coating portion for a surface of a substrate 22, a cleaning portion for a rear surface and an end surface of the substrate 23, and a substrate heating portion 24 which surround the robot 20. Also, in this embodiment, another tray 1 is provided in the cleaning portion 23 and the heating portion 24, and a substrate is transferred by the robot 20 to each tray 1.

The loader/unloader portion 21 is comprised of a loader portion 21a and an unloader portion 21b. A loader portion for a substrate of a different size may be provided instead of the loader portion 21a and the unloader portion 21b.

A cleaning portion 25 for the tray 1 is provided in the coating portion 22, a liquid stock portion 26 is provided adjacent to the coating portion 22, and an oven or a baking device is provided in the substrate heating portion 24. However, the substrate heating portion 24 may be provided so as to be stacked on the cleaning portion 23.

In order to form a coating film such as a resist film by using the coating-film forming apparatus, a layer of a coating liquid having a uniform thickness formed on the substrate W is dried by rotating the tray 1 in the coating portion 22, the spinner shaft 13 is lifted, and the substrate W is released from the recessed portion 11 of the tray 1. Next, the substrate W is received by a hand of the robot 20, transferred to the tray of the cleaning portion 23 so as to clean the edge surface and/or the rear surface, received by the hand of the robot 20 again, transferred to the heating portion 24, and finally a coating film is formed.

In the above-mentioned embodiment, "coating", "drying by rotation", "cleaning of the rear surface and/or the end surface", and "baking or oven" are performed in this order. However, in a case where the viscosity of the coating liquid is low, the order of "coating", "drying by rotation", "baking or oven", and "cleaning of the rear surface and/or the end surface" is also possible. If there is a step of drying by rotation, the substrate may stick to the tray, causing the substrate to deform when the substrate is released from the tray depending on the kind of the coating liquid. Therefore, it is possible to perform a coating-film forming method having no "drying by rotation" step and comprising the steps of "coating", "cleaning of the rear surface and/or the end surface", and "baking or oven", or the steps of "coating", "baking or oven", and "cleaning of the rear surface and/or the end surface".

As is explained in the above, according to the present invention, it is possible to easily level a coating liquid supplied onto a surface of a substrate such as a semiconductor wafer and a glass substrate so as to have a uniform thickness without any edge bead.

Also, according to the present invention, it is possible to greatly reduce the amount of the wasted coating liquid compared to the conventional rotation coating technique.

Also, according to the present invention, since the structure is simple compared to the conventional slit nozzle, no delicate adjustment is required to form a coating film having a uniform thickness.

In addition, according to the present invention, since the processes from coating to cleaning can be performed without moving the tray, it is possible make the whole apparatus compact.

Also, since the above-mentioned coating apparatus is incorporated into the coating-film forming apparatus according to the present invention, it is possible for the robot to efficiently conduct transfer of the substrate, and a single robot becomes sufficient as a transfer device by employing the same tray in a heating device or a cleaning device.

Although there have been described what are the present exemplary embodiments of the invention, it will be understood that variations and modifications may be made thereto within the spirit and scope of the appended claims.

What is claimed is:

1. A coating-film forming apparatus comprising:
   a substrate loader/unloader portion;
   a coating portion for coating a surface of a substrate with a coating liquid;
   a substrate heating portion;
   a cleaning portion for at least one of a rear surface and an end surface of a substrate; and
   a robot for transferring a substrate to and from each said portion,
   wherein the coating portion comprises:
      a rotatable tray having a recessed portion for accommodating a substrate and rotatable together with the substrate;
      a nozzle for supplying a coating liquid; and
      an applicator for spreading the coating liquid,
      wherein the recessed portion has a depth which is substantially the same as a thickness of the substrate so that an upper surface of a substrate and an upper surface of the tray will be in the same plane when the substrate is accommodated into the recessed portion and the recessed portion has a similar shape to the substrate, the nozzle for supplying a coating liquid is positioned above a non-recessed portion of the tray and supplies a coating liquid onto a non-recessed portion of the upper surface of the tray to form a coating liquid pool, and the applicator is relatively movable in a horizontal direction in a state of maintaining a certain distance with respect to the upper surface of the substrate accommodated into the recessed portion and spreads the coating liquid of the coating liquid pool from the non-recessed portion of the upper surface of the tray onto the upper surface of the substrate.

2. The coating-film forming apparatus according to claim 1, wherein the same rotatable tray as provided in the coating portion is provided in the substrate heating portion and the cleaning portion.

3. The coating-film forming apparatus according to claim 1, wherein the applicator is a squeegee or a roller.

4. The coating-film forming apparatus according to claim 1, wherein the coating apparatus further comprises a spinner chuck which can be lifted and lowered, and is provided in the recessed portion of the tray.

5. The coating-film forming apparatus according to claim 1, wherein the applicator is a squeegee having an arc shape.

6. The coating-film forming apparatus according to claim 1, wherein the nozzle forms a coating liquid pool having an arc shape or a linear shape at an upstream side of the substrate with respect the moving direction of the applicator as a reference by at least one of rotating the tray by a predetermined angle and moving the nozzle.

7. The coating-film forming apparatus according to claim 1, wherein the recessed portion of the tray has a size and shape which are substantially the same as those of the substrate such that, when the substrate is placed in the recessed portion, the substrate substantially completely fills the recessed portion when viewed in plan.

* * * * *

UNITED STATES PATENT AND TRADEMARK OFFICE
CERTIFICATE OF CORRECTION

PATENT NO. : 7,611,581 B2  Page 1 of 1
APPLICATION NO. : 11/288991
DATED : November 3, 2009
INVENTOR(S) : Ohishi et al.

It is certified that error appears in the above-identified patent and that said Letters Patent is hereby corrected as shown below:

Column 2:
    Line 19, change "its handing" to --its handling--.
    Line 56, change "with respect the" to --with respect to the--.

Column 3:
    Line 44, change "same view as FIG. 1" to --same views as FIGS. 1(*a*) and (*b*), respectively,--.

Column 6:
    Line 13, change "it is possible make" to --it is possible to make--.

Column 8:
    Line 1, change "with respect the" to --with respect to the--.

Signed and Sealed this

Twentieth Day of April, 2010

David J. Kappos
*Director of the United States Patent and Trademark Office*